United States Patent [19]

Okumura

[11] Patent Number: 5,373,473
[45] Date of Patent: Dec. 13, 1994

[54] AMPLIFIER CIRCUIT AND SEMICONDUCTOR MEMORY DEVICE EMPLOYING THE SAME

[75] Inventor: Kenichi Okumura, Hyogo, Japan

[73] Assignee: Mitsubishi Denki Kabushiki Kaisha, Tokyo, Japan

[21] Appl. No.: 104,742

[22] Filed: Jul. 22, 1993

[30] Foreign Application Priority Data

Sep. 1, 1992 [JP] Japan .................. 4-233356

[51] Int. Cl.$^5$ ............................................. G11C 7/00
[52] U.S. Cl. .................... 365/208; 365/189.05; 365/190; 365/205; 365/207; 327/51
[58] Field of Search ............... 307/530; 365/208, 207, 365/205, 189.5, 190, 189.05

[56] References Cited

U.S. PATENT DOCUMENTS

| | | | |
|---|---|---|---|
| 4,509,147 | 4/1985 | Tanimura | 365/190 |
| 4,845,672 | 7/1989 | Watanabe | 365/190 |
| 4,879,681 | 11/1989 | Miwa | 307/530 |
| 4,891,792 | 1/1990 | Hanamura | 365/189.05 |
| 4,954,992 | 9/1990 | Kumanoya | 365/207 |
| 5,126,974 | 6/1992 | Sasaki | 365/207 |
| 5,148,063 | 9/1992 | Hotta | 365/208 X |
| 5,237,533 | 8/1993 | Papaliolios | 365/207 |
| 5,248,946 | 9/1993 | Murakami | 365/208 X |
| 5,282,166 | 1/1994 | Ozaki | 365/208 X |

FOREIGN PATENT DOCUMENTS

| | | |
|---|---|---|
| 55-92008 | 7/1980 | Japan . |
| 62-84487 | 4/1987 | Japan . |
| 63-178607 | 7/1988 | Japan . |
| 63-253706 | 10/1988 | Japan . |

Primary Examiner—Eugene R. LaRoche
Assistant Examiner—Son Mai
Attorney, Agent, or Firm—Lowe, Price, LeBlanc & Becker

[57] ABSTRACT

There is provided an improved amplifier circuit responsive to two complementary input signals VI, /VI for providing an amplified output signal VO. In the amplifier circuit, a PMOS transistor and an NMOS transistor alternatingly rendered conductive in response to the input signal VI are connected in series between a power supply potential Vcc and a ground potential. When the input signal VI at a high level is applied, transistor is turned on, while transistor is turned off. Since feed-through current flowing from the power supply potential towards the ground potential is prevented, the power consumption and operation speed can be improved.

10 Claims, 6 Drawing Sheets

AMPLIFIER CIRCUIT AND SEMICONDUCTOR MEMORY DEVICE EMPLOYING THE SAME

BACKGROUND OF THE INVENTION

1. Field of the Invention

The present invention relates generally to amplifier circuits, and particularly to the improvement of an amplifier circuit of a current mirror type. The present invention has particular applicability to semiconductor memory devices, preferably dynamic random access memory devices (DRAMs).

2. Description of the Background Art

Recently, in advancing high integration of a semiconductor integrated circuit device, reduction in power consumption is desired. Higher speed operation is also desired in a semiconductor integrated circuit device. Generally, a semiconductor integrated circuit device, such as a semiconductor memory, includes an amplifier circuit. Low power consumption and high speed operation, therefore, are desired also in an amplifier circuit formed on the semiconductor substrate.

Although the present invention is generally applicable to an amplifier circuit provided in a semiconductor integrated circuit device, the example in which the present invention is applied to a dynamic random access memory (hereinafter referred to as "DRAM") will be described in the following.

FIG. 6 is a block diagram of a conventional DRAM. Referring to FIG. 6, a DRAM 100 includes a memory cell array 85 including a multiplicity of memory cells, an address buffer 81 receiving externally applied address signals A0 to An, a row decoder 82 and a column decoder 83 responsive to the received address signals for designating a row and a column in memory cell array 85, respectively, and a sense amplifier 84 for amplifying a data signal read from the memory cell. Input data Di is applied through a data input circuit 86. Output data Do is provided through a data output circuit 87.

DRAM 100 further includes a CAS input buffer 91 receiving an externally applied column address strobe signal /CAS, an RAS input buffer 92 receiving an externally applied row address strobe signal /RAS, and a clock generator 88 generating clock signal for controlling various circuits in DRAM 100.

In data write operation, the input data Di to be stored is applied to data input circuit 86, and a signal amplified by circuit 86 is applied to a switching circuit (Y gate circuit), not shown. Column decoder 83 selects one column in memory cell array 85 in response to a column address signal, so that a data signal is applied to one bit line (not shown). Row decoder 82 activates one word line (not shown) in response to a row address signal. The data signal is then written in the memory cell (not shown) selected by row decoder 82 and column decoder 83.

In data read operation, a stored data signal is supplied from a memory cell connected to a word line activated by row decoder 82 to a bit line (not shown). The data signal on each bit line is amplified by sense amplifier 84, and thereafter one amplified signal selected by column decoder 83 is applied to data output circuit 87. Data output circuit 87, which has the circuit structure shown in FIG. 7, amplifies the applied data signal to provide output data Do.

FIG. 7 is block diagram of data output circuit 87 shown in FIG. 6. Referring to FIG. 7, data output circuit 87 includes a preamplifier circuit 61 amplifying complementary input signals VI and /VI, a main amplifier circuit 62 amplifying an output signal VO from preamplifier circuit 61, and an output buffer circuit 63 providing output data Do to the outside. Preamplifier circuit 61 is activated in response to a preamplifier activation signal PAE applied from clock generator 88 shown in FIG. 6.

FIG. 8 is a schematic diagram of an amplifier circuit provided in preamplifier circuit 61 shown in FIG. 7. Referring to FIG. 8, amplifier circuit 40 of a current mirror type includes PMOS transistors 1 and 3 constituting a current mirror circuit, NMOS transistors 4 and 2 respectively operated in response to complementary input signals VI and /VI, an NMOS transistor 7 for controlling activation, and a PMOS transistor 10 and an NMOS transistor 11 constituting a transmission gate for equalization.

In operation, preamplifier circuit 40 is activated when the preamplifier activation signal PAE at a high level is applied. That is, transistor 7 is turned on, and transistors 10 and 11 are turned off. When the input signal VI at a low level is applied, transistors 1, 3 and 4 are turned off, while transistor 2 is turned on in response to the input signal /VI at a high level. Consequently, an output signal VO at a low level is provided through an output node NO.

When the input signal VI at a high level is applied, transistor 4 is initially turned on. Since transistor 4 is rendered conductive, the gate voltages of transistors 1 and 3 are reduced towards a ground potential. As a result, transistor 1 is turned on, so that the output signal VO at a high level is provided through output node NO.

In the inactive period, the preamplifier activation signal PAE at a low level is applied. In response to the signal PAE, transistor 7 is turned off, while transistors 10 and 11 are turned on. Since transistors 10 and 11 are rendered conductive, the potentials of two nodes NO and N1 are equalized.

As has already been described, when the input signal VI at a high level is applied, transistor 4 is turned on, and transistors 1 and 3 are also rendered conductive. In this case, therefore, a feed through current I' shown in FIG. 8 flows from a power supply potential Vcc towards the ground potential. Unnecessary current consumption increases because of the existence of the feedthrough current I'. In addition, since the current I' flows through transistors 4 and 7, the potential of node N1 is raised. Accordingly, the gate voltages of transistors 1 and 3 are raised, so that transistor 1 requires long time for being conductive sufficiently.

Specifically, as shown in the timing chart of FIG. 2, the feedthrough current I' is conducted after the time t3, so that the voltage level of an output signal VO' is gradually raised after once falling from the equalize level. Accordingly, the output signal VO' requires a time period $\Delta T1$ for attaining a desired high level at the time t5, which prevents fast amplifying operation.

SUMMARY OF THE INVENTION

One object of the present invention is to reduce power consumption in an amplifier circuit.

Another object of the present invention to improve an operation speed of an amplifier circuit.

Still another object of the present invention is to reduce power consumption in a semiconductor memory device.

A further object of the present invention is to improve a data reading speed of a semiconductor memory device.

Briefly, the amplifier circuit in accordance with the present invention includes a first field effect transistor of a first conductivity type and a second field effect transistor of a second conductivity type connected in series between first and second power supply potentials, and a switching circuit, a third field effect transistor of the first conductivity type and a fourth field effect transistor of the second conductivity type connected in series between the first and second power supply potentials. The first and third field effect transistors has the gate electrodes connected to a commonly connected node of the third and fourth field effect transistors. The second field effect transistor has its gate electrode connected to receive a first complementary input signal. The fourth field effect transistor has its gate electrode connected to receive a second complementary input signal. The switching circuit is rendered alternatingly conductive with the fourth field effect transistor in response to the first or second complementary input signal.

In operation, the switching circuit is rendered alternatingly conductive with the fourth field effect transistor in response to the first or second complementary input signal, preventing a feedthrough current from flowing through the switching circuit, and the first and second field effect transistors. Therefore, when the fourth field effect transistor is rendered conductive, the gate voltages of the first and third field effect transistors are not affected by the feedthrough current, allowing quick change of the level of an output signal.

The amplifier circuit in accordance with another aspect of the present invention includes a first amplifying circuit providing a first output signal in response to first and second complimentary input signals, a second amplifying circuit providing a second output signal in response to the first and second complementary input signals, and a third amplifying circuit providing a third output signal in response to the first and second output signals. The second amplifying circuit receives the first and second complementary input signals so that the first and second output signals are in the complementary relation. Each of the first and second amplifying circuits is constituted of the amplifier circuit recited in claim 1.

The semiconductor memory device in accordance with still another aspect of the present invention includes a memory cell array including a plurality of memory cells arranged in rows and columns, a row selecting circuit selecting a row in the memory cell array in response to an externally applied row address signal, a column selecting circuit selecting a column in the memory cell array in response to an externally applied column address signal, a sense amplifier amplifying a data signal provided from a memory cell designated by the row and column selected by the row selecting circuit and the column selecting circuit to provide first and second complimentary signals, and an amplifier circuit providing the amplified data signal in response to the first and second complementary signals provided from the sense amplifier. The amplifier circuit includes a first field effect transistor of a first conductivity type and a second field effect transistor of a second conductivity type connected in series between first and second power supply potentials, and a switching circuit, a third field effect transistor of the first conductivity type and a fourth field effect transistor of the second conductivity type connected in series between the first and second power supply potentials. The first and third field effect transistors have their gate electrode connected to a commonly connected node of the third and fourth field effect transistors. The fourth field effect transistor has its gate electrode connected to receive the first complementary signal. The second field effect transistor has its gate electrode connected to receive the first complementary signal. The fourth field effect transistor has its gate electrode connected to receive the second complementary signal. The switching circuit is alternatingly rendered conductive with the fourth field effect transistor in response to the first or second complementary signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
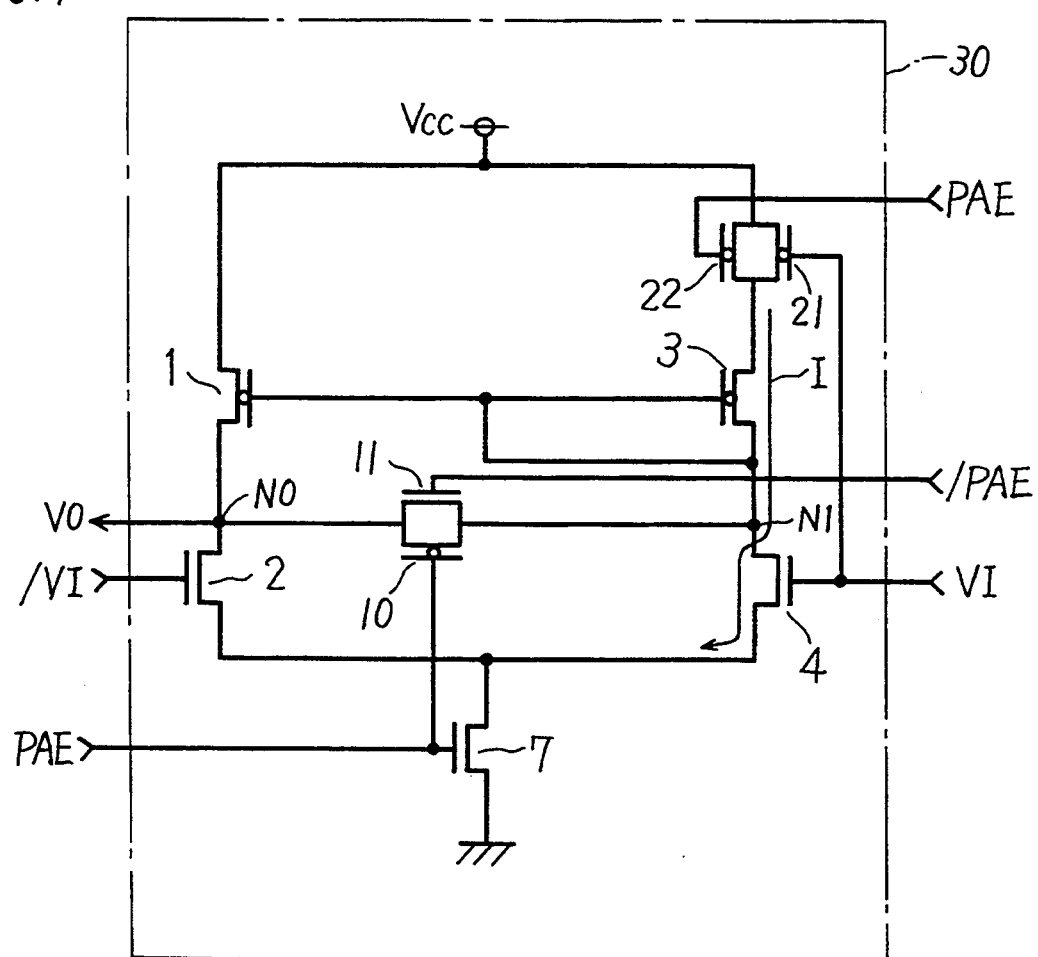
FIG. 1 is a schematic diagram of an amplifier circuit showing one embodiment of the present invention.
Figure 8:
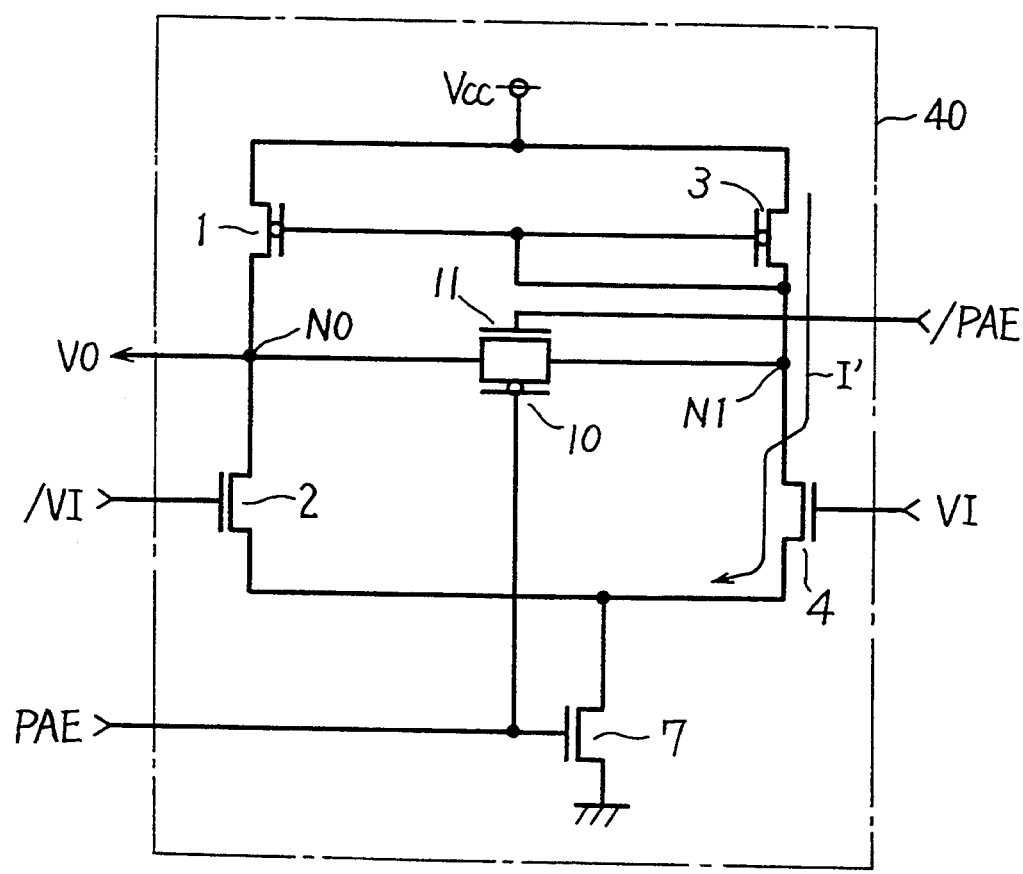
FIG. 8 is a schematic diagram of an amplifier circuit provided in the preamplifier circuit shown in FIG. 7.

Referring to FIG. 1, compared with amplifier circuit 50 shown in FIG. 8, an amplifier circuit 30 further includes PMOS transistors 21 and 22 connected in parallel between power supply potential Vcc and the source of PMOS transistor 3. Transistor 22 has its gate connected to receive a preamplifier activation signal PAE.

In operation, when the preamplifier activation signal PAE at a high level is applied, amplifier circuit 30 is activated. Specifically, transistor 7 is turned on, while transistor 10, 11 and 22 are turned off. When an input signal VI at a low level is applied, transistors 1, 3 and 4 are turned off, while transistor 21 is turned on. Transistor 2 is turned on in response to an input signal /VI at a high level. Consequently, an output signal VO at a low level is provided through output node NO.

When the input signal VI at a high level is applied, transistors 1, 3 and 4 are turned on, while transistors 2 and 21 are turned off. Consequently, the output signal VO at a high level is applied through output node NO.

In this case, since transistor 21 is turned off in response to the input signal VI at a high level, a feedthrough current flowing from power potential Vcc toward the ground potential through transistors 3 and 4 is not present. This prevents unnecessary power consumption. In addition, since the potential of node N1 is not raised, the gates of PMOS transistors 1 and 3 can be supplied with the ground potential. Consequently, transistor 1 can be turned on quickly, and the output signal VO having the power potential Vcc can be provided quickly. This can be described as follows, with reference to the timing chart of FIG. 2.

Figure 2:
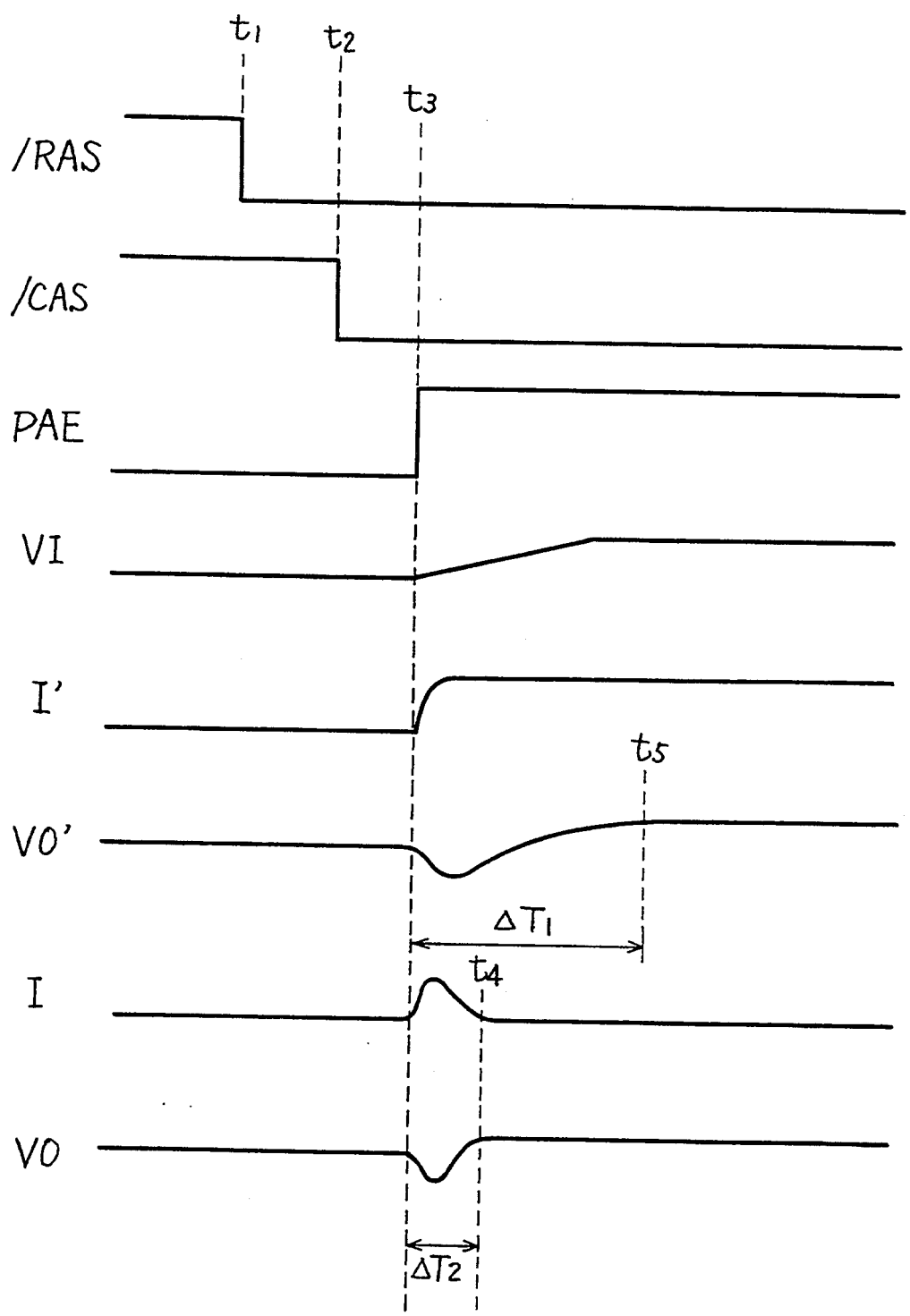
FIG. 2 is a timing chart showing the operation of the amplifier circuit shown in FIG. 1.

Referring to FIG. 2, after the signal /RAS falls at the time t1, the signal /CAS falls at the time t2. The preamplifier activation signal PAE at a high level is applied at the time t3, and simultaneously the potential of the input signal VI is raised. Therefore, a feedthrough current I slightly flows through transistors 21, 3 and 4 for a short time period ΔT2 after the time t3. However, since transistor 21 is turned off, the current I is brought into approximately 0 level at the time t4. As a result, the potential of node N1 becomes a ground level, so that transistor 1 is rendered conductive quickly to provide the output signal VO at the level of the power supply potential Vcc. As shown in FIG. 2, ΔT2 is a time period required for the output signal VO to attain a desired high level after the signal PAE has risen, which is reduced compared with a time length ΔT1. The amplified output signal VO can thus attain a desired high level with the reduced time period, whereby fast operation can be accomplished.

When the preamplifier activation signal PAE at a low level is applied, transistor 7 is turned off, while transistors 10, 11 and 22 are turned on. A precharge potential is applied through transistor 22 to node N1, and equalization between nodes N0 and N1 is carried out by transistors 10 and 11 rendered conductive.

Figure 3:
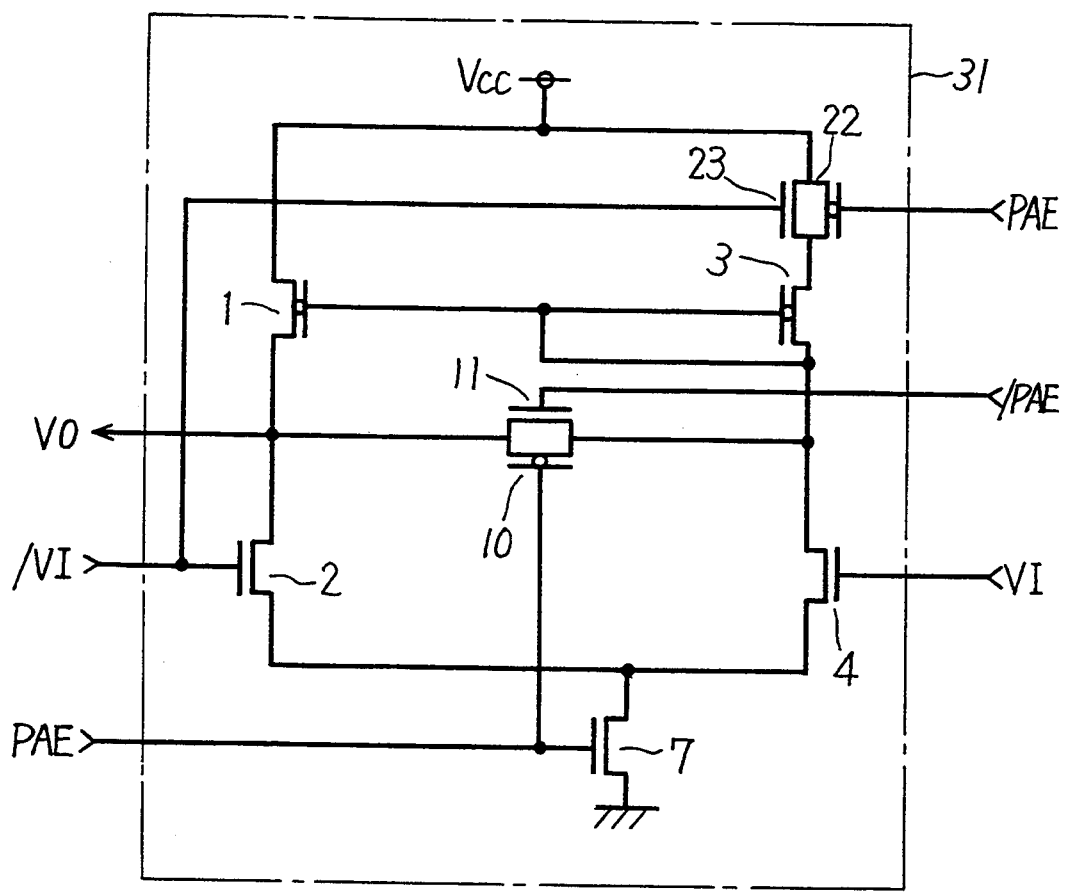
FIG. 3 is a schematic diagram of an amplifier circuit showing another embodiment of the present invention.

FIG. 3 is a schematic diagram of an amplifier circuit showing another embodiment of the present invention. Referring to FIG. 3, in comparison with amplifier circuit 30 shown in FIG. 1, an amplifier circuit 31 includes an NMOS transistor 23 in place of PMOS transistor 21. Transistor 23 has its gate connected to receive an input signal /VI. Since the other circuit structure is the same as circuit 30 shown in FIG. 1, the description thereof is not repeated. Amplifier circuit 31 shown in FIG. 3 operates similarly as circuit 30 shown in FIG. 1, whereby power consumption and operation speed thereof can be improved.

Figure 4:
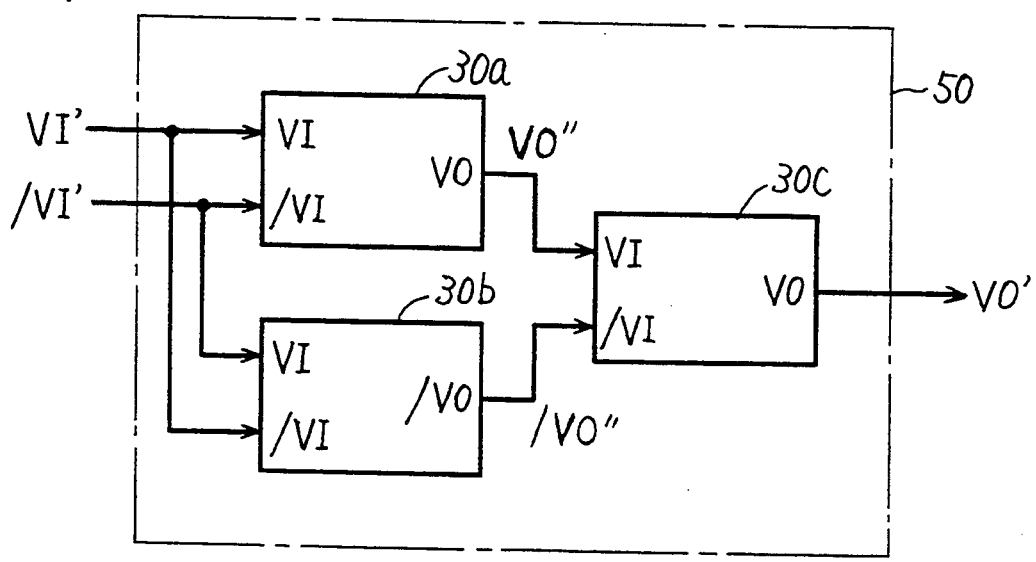
FIG. 4 is a schematic diagram of an amplifier circuit showing still another embodiment of the present invention.

FIG. 4 is a schematic diagram of an amplifier circuit showing still another further embodiment of the present invention. Referring to FIG. 4, an amplifier circuit 50 includes amplifying circuits 30a, 30b and 30c, each constituted of amplifier circuit 30 shown in FIG. 1. Amplifier circuit 50 provides an amplified output signal VO' in response to complementary input signals VI' and /VI'.

The first input signal VI' is applied as an input signal VI of amplifying circuit 30a, as well as an input signal /VI of amplifying circuit 30b. The second input signal /VI' is applied as the input signal /VI of amplifying circuit 30a, as well as the input signal VI of amplifying circuit 30b. Consequently, output signals VO" and /VO" in the complementary relation are provided from amplifying circuits 30a and 30b.

Amplifying circuit 30c receives the output signal VO" as the input signal VI, and the output signal /VO" as the input signal /VI. As a result, the output signal VO of amplifying circuit 30c is provided as the output signal VO' of amplifier circuit 50.

Figure 7:
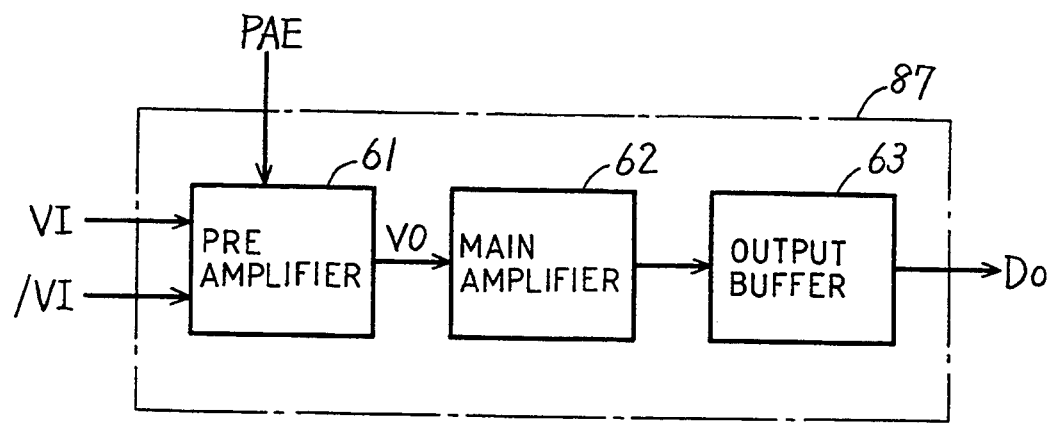
FIG. 7 is a block diagram of the data output circuit shown in FIG. 6.

Amplifier circuit 50 shown in FIG. 4 is applied where sufficient gain can not be obtained only by amplifier circuit 30 shown in FIG. 1. Since amplifier circuit 50 employs three amplifying circuits 30a, 30b and 30c, higher gain can be obtained. Amplifier circuit 50 shown in FIG. 4 can thus be preferably employed as a preamplifier circuit 61 shown in FIG. 7.

Figure 5:
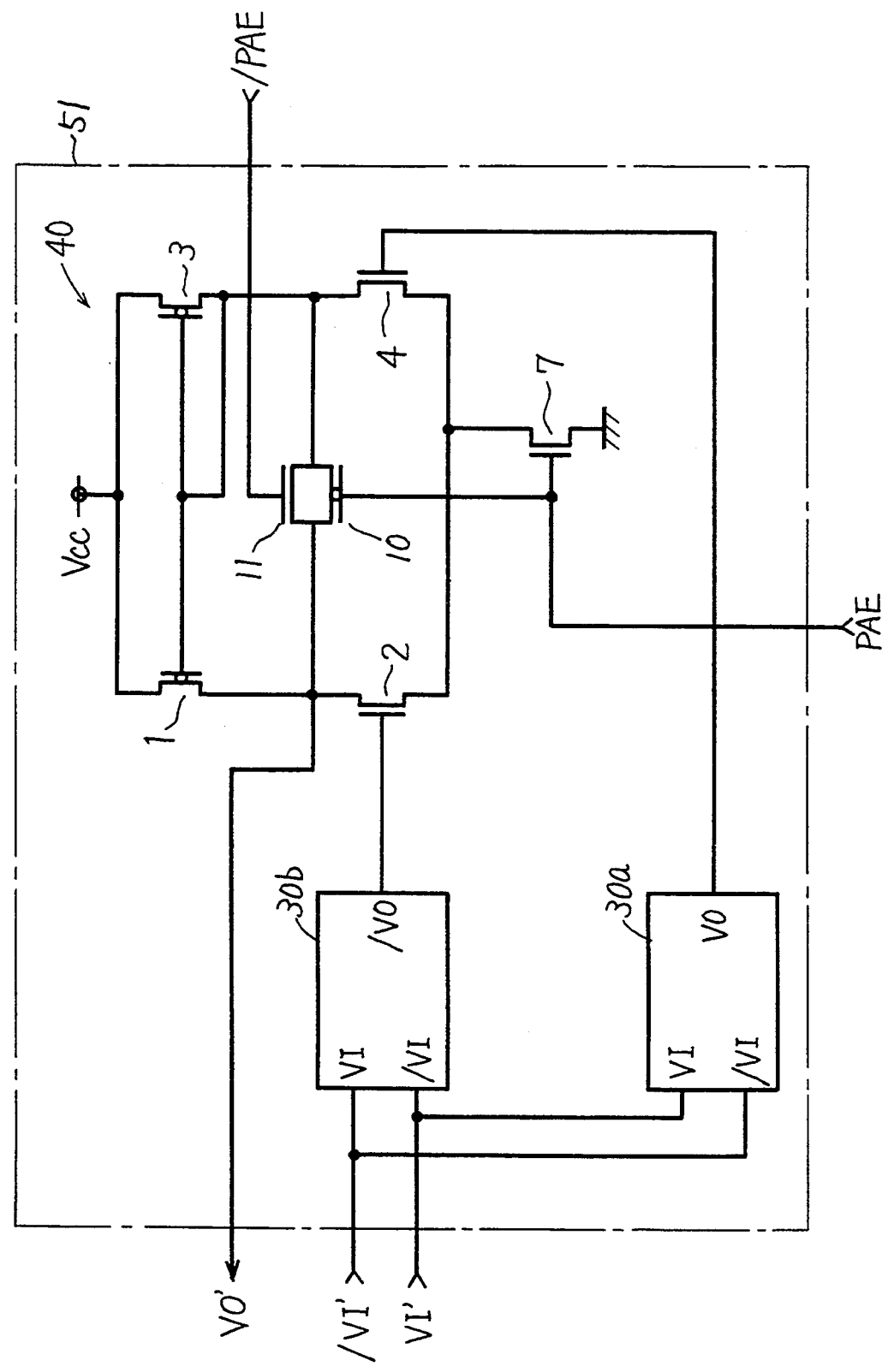
FIG. 5 is a schematic diagram of an amplifier circuit showing a further embodiment of the present invention.

FIG. 5 is a schematic diagram of an amplifier circuit showing a further embodiment of the present invention. Referring to FIG. 5, an amplifier circuit 51 includes amplifying circuits 30a and 30b, each constituted of amplifier circuit 30 shown in FIG. 1, and an amplifier circuit 40 constituted of amplifier circuit 40 shown in FIG. 8. In amplifier circuit 50 shown in FIG. 4, all of three amplifying circuits 30a, 30b and 30c are constituted of amplifier circuit 30 shown in FIG. 1, while the amplifying circuit of the succeeding stage is constituted of the amplifier circuit shown in FIG. 8 in the embodiment shown in FIG. 5. Since amplifying circuit 30a and 30b are employed also in this embodiment, the advantages brought about by these circuits, that is, the advantages in power consumption and operation speed can be obtained.

As described above, in amplifier circuits 30 and 31 shown in FIGS. 1 and 3, transistors 21 and 23 alternatingly rendered conductive with transistor 4 are provided, respectively, whereby a current flow from power supply potential Vcc towards the ground potential through transistors 3 and 4 can be prevented. Since rise in the potential of node N1 is prevented, transistor 1 can be rendered conductive quickly. That is, since the output signal VO at a desired high level is quickly provided through transistor 1, the operation speed of amplifier circuits 30 and 31 can be improved.

Amplifier circuits 30 and 31 shown in FIGS. 1 and 3 are employed in the structure shown in FIG. 4 or 5 depending on the case. Higher gain can be obtained as required, by utilizing amplifier circuits 30 and 31 in the connection manner shown in FIG. 4 or 5.

Figure 6:
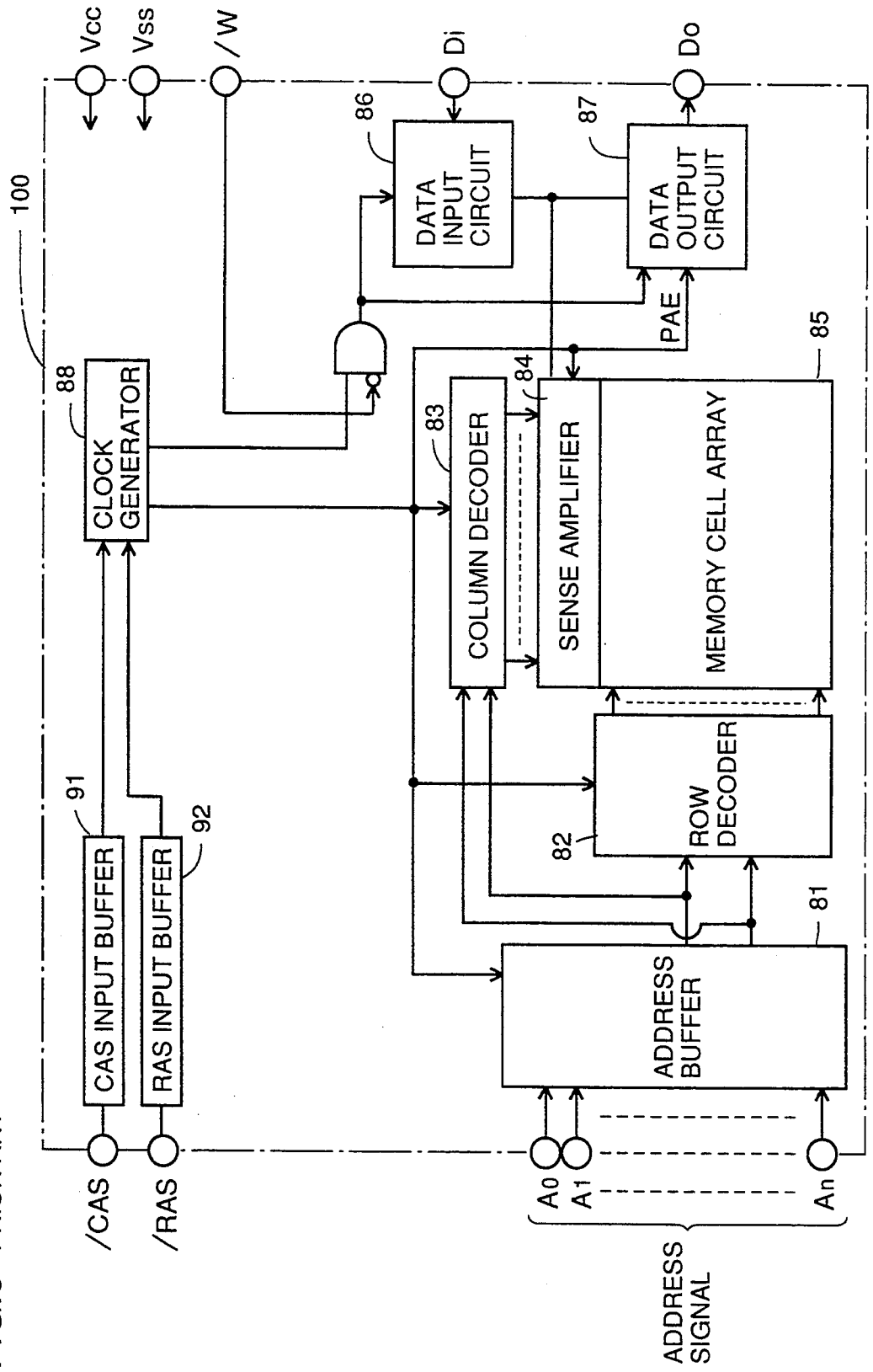
FIG. 6 is a block diagram of a conventional DRAM.

It is pointed out that the aforementioned amplifier circuits 30, 31, 50 and 51 are not only used in DRAM 100 shown in FIG. 6, but are in general use of a semiconductor integrated circuit device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplifier circuit providing an amplified output signal in response to first and second complementary input signals, comprising:
    a first field effect transistor of a first conductivity type and a second field effect transistor of a second conductivity type connected in series between the first and second power supply potentials;
    switching means connected in series between the first and second power supply potentials;
    a third field effect transistor of the first conductivity type; and
    a fourth field effect transistor of the second conductivity type;
    said first and third field effect transistors having their gate electrodes connected to a commonly connected node of said third and fourth field effect transistors,
    said second field effect transistor having its gate electrode connected to receive the first complementary input signal,
    said fourth field effect transistor having its gate electrode connected to receive the second complementary input signal, and said switching means alternatingly rendered conductive with said fourth field effect transistor in response to the first or the second complementary input signal; and equalization means for equalizing a commonly connected node of said first and second field effect transistors and the commonly connected node of said third and fourth field effect transistors to a predetermined potential during an inactivate period of said amplifier circuit.

2. The amplifier circuit according to claim 1, wherein said equalization means includes second switching means connected across said first switching means, and rendered conductive in response to an inactivate signal, and third switching means connected between the commonly connected node of said first and second field effect transistors and the commonly connected node of said third and fourth field effect transistors, and rendered conductive in response to an inactivate signal.

3. The amplifier circuit according to claim 2, wherein said third switching means includes a CMOS transmission gate connected between the commonly connected node of said first and second field effect transistors and the commonly connected node of said third and fourth field effect transistors, and rendered conductive in response to the inactivate signal.

4. An amplifier circuit providing an amplified output signal in response to first and second complementary input signals, comprising:

a first field effect transistor of a first conductivity type and a second field effect transistor of a second conductivity type connected in series between the first and second power supply potentials;

switching means connected in series between the first and second power supply potentials;

a third field effect transistor of the first conductivity type; and a fourth field effect transistor of the second conductivity type, said first and third field effect transistors having their gate electrodes connected to a commonly connected node of said third and fourth field effect transistors, said second field effect transistor having its gate electrode connected to receive the first complementary input signal, said fourth field effect transistor having its gate electrode connected to receive the second complementary input signal, said switching means alternatingly rendered conductive with said fourth field effect transistor in response to the first or the second complementary input signal said first switching means being a fifth field effect transistor of the first conductivity type, and said fifth field effect transistor having its gate electrode connected to receive the second complementary input signal.

5. An amplifier circuit providing an amplified output signal in response to first and second complementary input signals, comprising:

a first field effect transistor of a first conductivity type and a second field effect transistor of a second conductivity type connected in series between the first and second power supply potentials;

switching means connected in series between the first and second power supply potentials;

a third field effect transistor of the first conductivity type; and a fourth field effect transistor of the second conductivity type;

said first and third field effect transistors having their gate electrodes connected to a commonly connected node of said third and fourth field effect transistors, said second field effect transistor having its gate electrode connected to receive the first complementary input signal, said fourth field effect transistor having its gate electrode connected to receive the second complementary input signal, and said switching means alternatingly rendered conductive with said fourth field effect transistor in response to the first or the second complementary input signal said first switching means being a sixth field effect transistor of the second conductivity type, and said sixth field effect transistor having its gate electrode connected to receive the first complementary input signal.

6. The amplifier circuit according to claim 4, wherein said first conductivity type is a P channel type, and said second conductivity type is an N channel type.

7. An amplifier circuit, comprising:

a first amplifying circuit responsive to first and second complementary input signals for providing a first output signal;

a second amplifying circuit responsive to the first and second complementary input signals for providing a second output signal, each of said first and second amplifying circuits comprising:

a first field effect transistor of a first conductivity type and a second field effect transistor of a second conductivity type connected in series between first and second power supply potentials;

switching means connected in series between the first and second power supply potentials;

a third field effect transistor of the first conductivity type; and a fourth field effect transistor of the second conductivity type;

wherein said first and third field effect transistors have their gate electrodes connected to a commonly connected node of said third and fourth field effect transistors, said second field effect transistor has its gate electrode connected to receive the first complementary input signal, said fourth field effect transistor has its gate electrode connected to receive the second complementary input signal, and said switching means is alternatingly rendered conductive with said fourth field effect transistor in response to the first or the second complementary input signal;

said second amplifying circuit receiving said first and second complementary input signals so that said second output signal is in the complementary relation with said first output signal; and a third amplifying circuit responsive to said first and second output signals for providing a third output signal.

8. The amplifier circuit according to claim 7, wherein said third amplifying circuit comprises:
   a first field effect transistor of a first conductivity type and a second field effect transistor of a second conductivity type connected in series between first and second power supply potentials;
   switching means connected in series between the first and second power supply potentials;
   a third field effect transistor of the first conductivity type; and
   a fourth field effect transistor of the second conductivity type;
   wherein said first and third field effect transistors have their gate electrodes connected to a commonly connected node of said third and fourth field effect transistors,
   said second field effect transistor has its gate electrode connected to receive the first complementary input signal,
   said fourth field effect transistor has its gate electrode connected to receive the second complementary input signal, and said switching means is alternatingly rendered conductive with said fourth field effect transistor in response to the first or the second complementary input signal;

9. The amplifier circuit according to claim 7, wherein said third amplifying circuit includes
   a seventh field effect transistor of a first conductivity type and a eighth field effect transistor of a second conductivity type connected in series between first and second power supply potentials, and
   a ninth field effect transistor of the first conductivity type and a tenth field effect transistor of the second conductivity type connected in series between the first and second power supply potentials,
   wherein said seventh and ninth field effect transistors have their gate electrodes connected to a commonly connected node of said ninth and tenth field effect transistor,
   said eighth field effect transistor has its gate electrode connected to receive an output signal from said first amplifying circuit, and
   said ninth field effect transistor has its gate electrode connected to receive an output signal from said second amplifying circuit.

10. A semiconductor memory device, comprising:
    a memory cell array including a plurality of memory cells arranged in rows and columns;
    row selecting means responsive to an externally applied row address signal for selecting a row in said memory cell array;
    column selecting means responsive to an externally applied column address signal for selecting a column in said memory cell array;
    sense amplifier means for amplifying a data signal provided from the memory cell designated by the row and column selected by said row selecting means and said column selecting means, to provide first and second complementary signals; and
    amplifier means connected to the output of said sense amplifier means, and responsive to the first and second complementary signals for providing an amplified data signal,
    said amplifier means including
    first field effect transistor of a first conductivity type and a second field effect transistor of a second conductivity type connected in series between first and second power supply potentials, and
    switching means connected in series between said first and second power supply potentials,
    a third field effect transistor of the first conductivity type and a fourth field effect transistor of the second conductivity type connected in series between the first and second power supply potentials,
    said first and third field effect transistor having their gate electrodes connected to a commonly connected node of said third and fourth field effect transistors,
    said second field effect transistor having its gate electrode connected to receive the first complementary input signal,
    said fourth field effect transistors having its gate electrode connected to receive the second complementary input signal,
    said switching means being alternatingly rendered conductive with said fourth field effect transistor in response to the first or second complementary input signal.

* * * * *